Oct. 19, 1965 W. O. FAITH ETAL 3,213,390
CRYSTAL OSCILLATOR WITH AMPLITUDE CONTROL LOOP
Filed Aug. 13, 1962
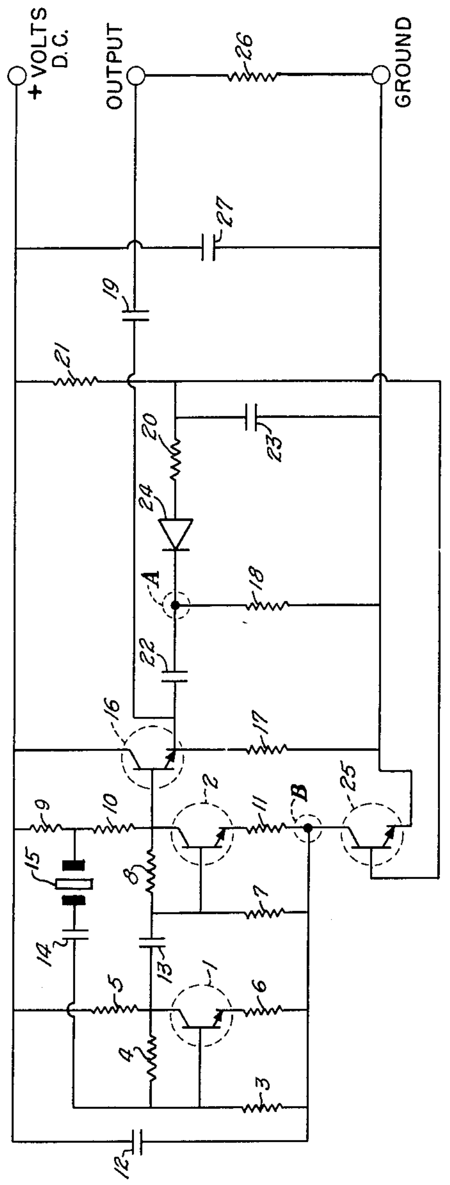
INVENTORS
Winston O. Faith
Edwin T. Sewall
BY Arthur M. Sloan
ATTORNEY United States Patent Office 3,213,390

Patented Oct. 19, 1965

3,213,390
CRYSTAL OSCILLATOR WITH AMPLITUDE CONTROL LOOP

Winston O. Faith, Garland, and Edwin T. Sewall, Dallas, Tex., assignors to Varo, Inc.

Filed Aug. 13, 1962, Ser. No. 216,606
1 Claim. (Cl. 331—109)

This invention relates to high stability frequency standards or crystal oscillators.

Quartz crystals have been used as frequency references for stabilizing oscillator circuits for many years. Since the initiation of transistors into the oscillator circuits, there have been many parameters which have secondary or direct effect on the stability of the oscillator frequency. For example, beta change of transistors from one unit to another and of a given unit over operating temperature range, shifts the frequency a sizeable amount due to several conditions in the oscillator. Power supply voltage variations also have contributed to instability in the frequency of the oscillator. Many of these effects can be traced to a change in driving power on the crystal, causing phase shift and distortion in the oscillator. Thus, if a transistor-oscillator is optimized at low temperature, with the proper amount of feedback through the crystal to achieve best frequency stability and good wave form (low distortion) and then the transistor oscillator is raised in temperature, the gain increases, and, due to excessive feed back drive to the crystal, distortion and phase shift in the loop occurs, both contributing to frequency changes.

In the frequency standard subject of this invention, a portion of the output voltage is rectified and filtered. The resulting D.C. voltage, whose amplitude is proportional to the oscillator output, is compared to a reference D.C. current drawn from the B+ power supply through the base of a D.C. control transistor and the resulting difference current adjusts the degree of saturation of the control transistor. This in turn provides a D.C. supply voltage to the basic oscillator which will force it to operate at a level determined by the preset reference current in the control transistor base. This scheme actually provides a second closed loop around the oscillator purely for control of the amplitude. The first closed loop is the normal feed back through the crystal for control of the frequency.

It is an object of my invention to provide an improved transistor oscillator.

It is a further object of my invention to provide a high stability frequency standard wherein the amount of drive power to the crystal is controlled so that the oscillator always operates at a point with near optimum conditions.

Another object of this invention is to provide a high stability frequency standard which overcomes many of the problems normally encountered in frequency control as a result of parameter deviations in the circuit.

Still another object of this invention is to provide a transistor oscillator utilizing a crystal and having two closed loops.

Yet another object of this invention is to provide a high stability frequency standard having a second closed loop around the oscillator for control of amplitude.

A further object of this invention is to provide a high stability frequency standard in which either a crystal, a tuning fork, or any other suitable frequency reference device may be used.

The various objects and features of the invention will be better understood from the following complete description thereof when it is read in conjunction with the single figure of the drawing which shows a schematic circuit diagram of one embodiment of the high stability frequency standard of the invention.

Transistors 1 and 2, resistors 3 through 11, capacitors 12 through 14, and crystal 15 form a basic oscillator circuit with frequency of operation determined by the resonant frequency of crystal 15. It is not intended to limit this invention to one utilizing the particular basic oscillator circuit herein described, but any suitable basic oscillator circuit may be utilized, e.g., a basic oscillator circuit including only one transistor may be used.

Resistors 3 through 5 form a voltage divider to establish the bias for transistor 1, which serves as a signal amplifier. Resistor 6 is an unbypassed emitter resistor which adds negative feedback to the transistor 1 stage to reduce distortion of the signal. Resistor 5 is the collector load resistor across which the output signal of the transistor 1 stage is developed. This output signal is then coupled by capacitor 13 to the base of transistor 2 which element further amplifies the signal. Bias for transistor 2 is established by resistors 7, 8, 9, and 10, which form a voltage divider.

An additional function of both resistor 4 and resistor 8 is transistor operating point stabilization so that any change in the operating point of the transistor, whether caused by a change in transistor temperature or caused by the normal parameter variation of the transistors will be corrected for. If for some reason the collector current decreases, there will be less voltage drop across the load resistor and resistor 4 or resistor 8, as the case may be, will then apply more base current to the transistor causing the collector current to return to its proper level. Conversely, if for some reason the collector current increases, there will be more voltage drop across the load resistor and resistor 4 or resistor 8 will apply less base current to the transistor, again causing the collector current to return to its proper level. The effect of resistor 4 and resistor 8 on the signal handling properties of transistor 1 and transistor 2 respectively, is the addition of negative feedback. Any output signal which was not caused by an input signal will tend to be cancelled out by this negative feedback. Reduced signal distortion is the result.

Resistor 11 is an unbypassed emitter resistor which adds negative feedback to the transistor 2 stage to reduce distortion of the output signal. This output signal appears across the transistor 2 collector load resistor, which is the sum of resistors 9 and 10. Resistors 9 and 10 also form a divider which permits a portion of the output signal voltage to be applied to crystal 15 which, in series with capacitor 14, forms a frequency selective feedback element. The signal which is thus fed back to the base of transistor 1 is then amplified by transistor 1 and transistor 2 to appear as an output signal at the collector of transistor 2. In this manner, oscillation is maintained. The manner in which the initial oscillation is created is explained below. The value of capacitor 14 may be varied to provide a slight adjustment of oscillator frequency.

The oscillator output signal appearing at the collector of transistor 2 is fed directly to the base of transistor 16, which element together with resistor 17, forms an emitter follower power amplifier to isolate the basic oscillator section from loading effects of the rest of the circuit. The output signal appearing at the emitter of transistor 16 is capacity coupled by capacitor 19 to become the output signal from the entire circuit.

Resistors 18, 20, and 21; capacitors 22 and 23; diode 24; and transistor 25 form a closed loop output amplitude controlling circuit, which maintains a constant output signal amplitude across the load resistor 26. This control circuit will maintain a constant amplitude even though the behavior of a number of the circuit elements may vary and try to influence the circuit to change the output signal amplitude.

A portion of the signal at the emitter of transistor 16 is removed by capacitor 22 and rectified by diode 24 to create a voltage with respect to ground at point A. The magnitude and polarity of this voltage is determined by the amplitude of the signal at the emitter of transistor 16.

Resistors 20 and 21, diode 24, and resistor 18 form a voltage divider between the supply voltage and ground, so that when there is no signal at the emitter of transistor 16, a small positive voltage will exist at point A with respect to ground.

When the amplitude of the signal at the emitter of transistor 16 is above a certain level, a negative charge will be produced on capacitor 22 at point A, due to the rectifying action of diode 24. This negative voltage will permit most of the current flowing through resistor 21 to proceed through resistor 20, diode 24, and then resistor 18 to ground.

When the amplitude of the signal at the emitter of transistor 16 is below a certain level, the negative voltage at point A will be sufficiently small so that most of the current flowing through resistor 21 will proceed on through the base-emitter junction of transistor 25 to ground, since that is a lower impedance path to ground than the resistor 20, diode 24, resistor 18 path to ground. Therefore, the amount of direct current permitted to flow into transistor 25 as base current is a function of the magnitude of the signal at the emitter of transistor 16 such that the larger this signal magnitude, the smaller the transistor 25 base current, and the smaller the signal magnitude, the larger the transistor 25 base current. The application of base current to transistor 25 causes that transistor to conduct current which causes the voltage at point B with respect to ground to vary between the plus supply voltage and ground, in a manner such that the more base current applied to transistor 25, the lower the voltage at point B, and the less base current applied to transistor 25, the greater the voltage at point B.

When the voltage at point B is quite close to ground potential, maximum voltage is applied to the oscillator circuit and maximum output signal amplitude from the oscillator and likewise from the emitter follower power amplifier stage is the result because the output signal amplitude of the oscillator is very nearly directly proportional to the voltage applied across the oscillator section of the circuit.

In a similar manner, when the voltage at point B is quite close to the power supply potential, minimum voltage is applied to the oscillator circuit and minimum output signal amplitude from the oscillator circuit and from the emitter follower power amplifier stage is the result.

The operation of this circuit may, therefore, be described as follows: When the output signal amplitude at the emitter of transistor 16 falls below a certain definite established value, the direct current voltage at point A will be such that more of the current flowing through resistor 21 will be encouraged to flow into the base emitter junction of transistor 25, which will cause more transistor 25 collector current to flow, reducing the voltage at point B, and applying more voltage across the basic oscillator section of the circuit. This increased oscillator voltage will cause a corresponding increase in the basic oscillator output signal amplitude and likewise increased signal amplitude at the emitter of transistor 16. Conversely, an output signal amplitude at the emitter of transistor 16 in excess of the certain definite established amplitude will cause the direct current voltage at point A to be such as to encourage more of the current flowing through resistor 21 to take the resistor 20, diode 24, resistor 18 path to ground, which will make less base current available to transistor 25. The reduced transistor 25 base current will result in reduced transistor 25 collector current and likewise increased voltage at point B and decreased voltage applied across the basic oscillator section of the circuit. This decreased oscillator voltage will cause a corresponding decrease in the oscillator output signal amplitude and likewise decreased signal amplitude at the emitter of transistor 16.

This action forces a very nearly constant output signal amplitude at the emitter of transistor 16, at all times, which likewise forces a very nearly constant signal amplitude across the load resistor 26 regardless of wide variations throughout the circuit including a variation of the resistance of the load resistor 26 from an infinitely large value to very low values of resistance. Also, variations caused by the effects of temperature on the crystal 15 and variations caused by the effects of temperature on the transistors, resistors, and capacitors in the circuit are corrected for to the extent that a very nearly constant signal amplitude will be maintained across the load resistor 26. The exact amplitude which the closed loop amplitude controlling circuit will maintain, may be varied within reasonable limits by varying the resistance of resistor 21. An increase in the resistance of resistor 21 will decrease the controlled amplitude. A decrease in the resistance of resistor 21 will increase the controlled amplitude.

The purpose of capacitor 12 is to filter and smooth out the voltage appearing between point B and the supply voltage. The voltage between these two points is the voltage which is applied across the basic oscillator portion of the circuit. Capacitor 23 filters and smooths out the direct current signal voltage applied to the base of transistor 25. Capacitor 23 also provides a low impedance alternating current path to ground from which current is drawn through resistor 20 and diode 24 to point A, when required for proper operation of the circuit. The purpose of capacitor 27 is to reduce any ripple which might appear on the power supply applied voltage.

Resistor 20 is to prevent distortion of the output signal by severe loading to ground through the capacitor 22, diode 24, and capacitor 23 path. Also, resistor 20 adds direct current resistance to the path of the portion of current from resistor 21 which is not going to flow through transistor 25 to ground.

The value of resistor 9 is chosen to provide just enough signal feedback to the crystal 15 so that the basic oscillator circuit is just on the verge of oscillation when the voltage applied across the basic oscillator circuit is somewhat more than the desired output peak to peak signal voltage. This insures that the crystal 15 is driven very lightly and that, therefore, the signal fed back to the input of the basic oscillator contains the minimum possible amount of distortion.

When voltage is first applied to the entire circuit and before the basic oscillator section is in operation, full power supply voltage less the saturation voltage of transistor 25 is applied to the basic oscillator circuit, because transistor 25 will be saturated. Saturation of transistor 25 is assured because the current through resistor 21 will take the lowest resistance path to ground, and as long as the basic oscillator is not operating, the lowest resistance path to ground will always be the base emitter junction of transistor 25, because this path is one forward directed silicon diode junction. The only other path which current from resistor 21 could take contains one forward directed silicon diode junction plus resistors 18 and 20. This assurance of ample base current for transistor 25 insures the saturation of transistor 25.

The fact that full power supply voltage less the saturation voltage of transistor 25 is initially applied to the basic oscillator insures that it will always start, because the gain through the oscillator is considerably greater with this full voltage applied than it is when the oscillator is operating with reduced voltage applied. This will always be true so long as the beta of the transistors 1 and 2 increases with increasing collector current in the range of collector currents drawn by transistors 1 and 2.

The effect of temperature changes on the operation of the closed loop amplitude control portion of this circuit will be very slight because the only two temperature sensitive elements in that portion of the circuit are the diode 24 and the transistor 25. Since these devices are both made of silicon, the forward voltage drop across diode 24 will always remain very close to the voltage drop across the base emitter junction of transistor 25 so long as they are both at approximately the same temperature. One of these silicon devices is in each of the two current paths which current from resistor 21 may take. As long as the voltage drop across these two devices is approximately the same, they are self compensating in effect, and the net result is very stable operation over a temperature range.

Tuning forks or other frequency reference devices may be used in place of the crystal 15.

While there has been described herein and illustrated in the accompanying drawing a preferred embodiment of the present invention, it is to be understood that various modifications, omissions, and refinements which depart from the illustrated embodiment may be adopted without departing from the spirit and scope of the present invention.

What we claim is:

A high stability frequency standard comprising a basic transistor oscillator circuit, an emitter follower power amplifier including a transistor and a resistor in series with the transistor emitter electrode, and a closed loop around the oscillator for control of the output signal amplitude, said closed loop including a capacitor, a diode, and a resistor in series connected to one end with the emitter electrode of the emitter follower power amplifier transistor, a transistor having its collector electrode connected to one side of the basic transistor oscillator circuit, its emitter electrode connected to ground, and its base electrode connected to the other side of the basic transistor oscillator circuit and to the other end of the capacitor, diode, and resistor connected in series with the emitter electrode of the emitter follower power amplifier transistor, a resistor in series with the base electrode of the closed loop transistor, and a resistor and capacitor connected to the emitter electrode of the closed loop transistor, such resistor and capacitor being connected in parallel with each other and in parallel with the emitter follower power amplifier resistor, a capacity coupling capacitor coupling the emitter electrode of the emitter follower power amplifier transistor to produce the output signal from the entire circuit, a D.C. power supply connected between one side of the basic transistor oscillator circuit and the collector electrode of the closed loop transistor, a ripple reduction capacitor connected between the direct current power supply and ground for reducing ripple on the power supply applied voltage, and a load resistor connected between the output signal and ground for maintaining a very nearly constant signal amplitude whereby only the minimum feedback drive required to maintain the frequency reference in a state of oscillation is applied to the frequency reference.

References Cited by the Examiner

UNITED STATES PATENTS

| | | | |
|---|---|---|---|
| 2,568,868 | 9/51 | Pratt | 331—186 |
| 2,912,654 | 11/59 | Hansen | 331—117 |
| 2,950,445 | 8/60 | Smith et al. | 331—52 |
| 2,950,446 | 8/60 | Humez et al. | 331—183 |
| 2,959,745 | 11/60 | Grieg | 331—113 |
| 3,040,272 | 6/62 | Hukee | 331—159 |
| 3,067,393 | 12/62 | Murray | 331—112 |

FOREIGN PATENTS

| | | |
|---|---|---|
| 453,837 | 1/49 | Canada. |
| 563,672 | 9/58 | Canada. |

OTHER REFERENCES

IBM Tech. Disclosure Bulletin, 1 page, Vol. 1, No. 1, June 1958.

ROY LAKE, *Primary Examiner.*

JOHN KOMINSKI, *Examiner.*